(12) United States Patent
Humphries et al.

(10) Patent No.: US 12,543,592 B2
(45) Date of Patent: Feb. 3, 2026

(54) THERMALLY CONDUCTIVE MATERIAL FOR ELECTRONIC DEVICES

(71) Applicant: Sumitomo Chemical Co., Ltd, Tokyo (JP)

(72) Inventors: Martin Humphries, Godmanchester (GB); Simon King, Godmanchester (GB); Thomas Fletcher, Godmanchester (GB); Antonio Attanzio, Godmanchester (GB); Kiran Kamtekar, Godmanchester (GB)

(73) Assignee: Sumitomo Chemical Co., Ltd, Tokyo (JP)

( * ) Notice: Subject to any disclaimer, the term of this patent is extended or adjusted under 35 U.S.C. 154(b) by 466 days.

(21) Appl. No.: 18/012,370

(22) PCT Filed: Jul. 2, 2021

(86) PCT No.: PCT/EP2021/068354
§ 371 (c)(1),
(2) Date: Dec. 22, 2022

(87) PCT Pub. No.: WO2022/003164
PCT Pub. Date: Jan. 6, 2022

(65) Prior Publication Data
US 2023/0268309 A1    Aug. 24, 2023

(30) Foreign Application Priority Data
Jul. 3, 2020   (GB) .................................. 2010228

(51) Int. Cl.
*H01L 23/00*   (2006.01)
*H01L 21/56*   (2006.01)
*H01L 25/065*   (2023.01)

(52) U.S. Cl.
CPC ............. *H01L 24/29* (2013.01); *H01L 21/563* (2013.01); *H01L 24/16* (2013.01); *H01L 24/27* (2013.01);
(Continued)

(58) Field of Classification Search
CPC ............. H01L 25/0657; H01L 25/0652; H01L 25/043; H01L 25/071; H01L 25/074;
(Continued)

(56) References Cited

U.S. PATENT DOCUMENTS 6,111,323 A     8/2000  Carter et al.
9,478,454 B2 * 10/2016  Takamoto ........... H01L 21/6836
(Continued)

FOREIGN PATENT DOCUMENTS

JP    2015183108 A  * 10/2015 ............. G03F 7/027
JP    2015-189883 A    11/2015
(Continued)

OTHER PUBLICATIONS

Islam et al. (2018) "Enhanced Thermal Conductivity of Liquid Crystalline Epoxy Resin Using Controlled Linear Polymerization," ACS Macro Lett., vol. 7, No. 10, pp. 1180-1185.
(Continued)

*Primary Examiner* — Wael M Fahmy
*Assistant Examiner* — Quinton A Brasfield
(74) *Attorney, Agent, or Firm* — Jenkins, Taylor & Hunt, P.A.

(57) ABSTRACT

An electrically non-conducting film (109) comprising an oligomer comprising an arylene or heteroarylene repeating unit is disposed between a chip (105), e.g. a flip-chip, and a functional layer (101), e.g. a printed circuit board, electrically connected to the chip by electrically conducting interconnects (107). The oligomer may be crosslinked.

15 Claims, 5 Drawing Sheets

(52) U.S. Cl.
CPC .............. *H01L 24/32* (2013.01); *H01L 24/73* (2013.01); *H01L 25/0657* (2013.01); *H01L 2224/16146* (2013.01); *H01L 2224/16148* (2013.01); *H01L 2224/16221* (2013.01); *H01L 2224/27416* (2013.01); *H01L 2224/27418* (2013.01); *H01L 2224/27422* (2013.01); *H01L 2224/2919* (2013.01); *H01L 2224/32145* (2013.01); *H01L 2224/32221* (2013.01); *H01L 2224/73204* (2013.01); *H01L 2225/06517* (2013.01); *H01L 2225/06572* (2013.01); *H01L 2924/152* (2013.01)

(58) Field of Classification Search
CPC .. H01L 25/0756; H01L 25/112; H01L 25/117; H01L 2224/08145; H01L 27/0688; H01L 2224/8385–83885; H01L 23/3185; H01L 23/3157; H01L 21/56; H01L 21/563; H01L 23/5389; H01L 2224/73204
See application file for complete search history.

(56) References Cited

U.S. PATENT DOCUMENTS

| | | |
|---|---|---|
| 2002/0105093 A1 | 8/2002 | Papathomas |
| 2004/0126586 A1 | 7/2004 | Hedrick et al. |
| 2014/0283982 A1* | 9/2014 | Pan ..................... B32B 37/0038 156/308.6 |
| 2015/0137362 A1* | 5/2015 | Lau ..................... H01L 23/3142 257/738 |
| 2015/0303122 A1* | 10/2015 | Malofsky ............. H01L 23/295 438/126 |
| 2020/0377715 A1* | 12/2020 | Yamatsu ............. C09D 151/003 |
| 2022/0216126 A1* | 7/2022 | Yamashita ............. H01L 25/50 |

FOREIGN PATENT DOCUMENTS

| | | | |
|---|---|---|---|
| JP | 2016-506072 A | 2/2016 | |
| JP | 2017-122742 A | 7/2017 | |
| WO | WO-00/34032 A1 | 6/2000 | |
| WO | WO-2015/146659 A1 | 10/2015 | |
| WO | WO-2015170432 A1 * | 11/2015 | ........... H01L 25/065 |
| WO | WO-2019/143823 A1 | 7/2019 | |
| WO | WO-2022/090523 A1 | 5/2022 | |

OTHER PUBLICATIONS

Liu et al. (2013) "A novel high thermal conductive underfill for flip chip application," white paper published online (http://yincae.com/assets/wp-1000-03 2013.pdf), Nov. 2013, 6 pages.

International Search Report and Written Opinion corresponding to International Patent Application No. PCT/EP2021/068354 dated Oct. 18, 2021.

Combined Search and Examination Report corresponding to GB Patent Application No. 2010228.1 dated Dec. 29, 2020.

Office Action corresponding to Japanese Patent Application Serial No. 2022-577738 dated May 26, 2025.

* cited by examiner

THERMALLY CONDUCTIVE MATERIAL FOR ELECTRONIC DEVICES

BACKGROUND

Thermally conductive materials are used in a wide variety of applications including in underfill for flip-chips to reduce thermally induced stresses following application of a flip chip.

Mary Liu and Dr. Wusheng Yin, "A novel high thermal conductive underfill for flip chip application" http://yin-cae.com/assets/wp-1000-03_2013.pdf discloses an underfill containing diamond powder.

Islam et al, "Enhanced Thermal Conductivity of Liquid Crystalline Epoxy Resin using Controlled Linear Polymerization", *ACS Macro Lett.* 2018, 7, 10, 1180-1185 discloses liquid crystalline epoxy resin with a 2-D boron nitride filler.

WO 2019/143823 discloses thermally conductive quinoid-type conjugated polymer thin films fabricated by oxidative chemical vapour deposition.

SUMMARY

In some embodiments, there is provided an electronic device comprising a first chip having a first surface; a functional layer having a surface facing the first chip first surface; electrically conducting interconnects between the first chip and the functional layer; and an electrically non-conducting film disposed in a region between the first surface of the first chip and the first surface of the functional layer and between the interconnects. The electrically non-conducting film comprises an oligomer comprising an arylene or heteroarylene repeating unit.

Optionally, the oligomer is a rigid rod oligomer.

Optionally, the oligomer is crosslinked.

Optionally, thermal conductivity of the electrically non-conducting film is at least 0.2 $Wm^{-1}K^{-1}$ Optionally, the functional layer is selected from a printed circuit board; an interposer; and a second chip.

Optionally, the electronic device comprises a 3D chip stack.

In some embodiments, there is provided a method of forming an electronic device as described herein, wherein electrically conductive features on the first surface of the first chip are brought into contact with electrically conductive features on the first surface of the functional layer and wherein formation of the electrically non-conducting film comprises introducing a formulation comprising the oligomer dissolved in one or more solvents into the region between the first chip and the functional layer.

In some embodiments, there is provided a method of forming an electronic device as described herein, wherein the method comprises formation of the electrically non-conducting film over electrically conductive features on the first surface of the first chip; and bringing the electrically conductive features on the first surface of the first chip into contact with electrically conductive features on the first surface of the functional layer.

Optionally, formation of the electrically non-conducting film comprises crosslinking of the oligomer.

Optionally, the crosslinking comprises reaction of a reactive substituent of the oligomer.

Optionally, the reactive substituent comprises a first reactive group $X^1$ and a second reactive group $X^2$ wherein $X^1$ is capable of reacting with $X^2$ to form a covalent bond.

In some embodiments there is provided a method of forming a film comprising depositing a formulation comprising an oligomer dissolved or dispersed in one or more solvents onto a surface; evaporating the one or more solvents; and reacting a reactive substituent of the oligomer to form a covalent bond between oligomer chains.

Optionally, the reactive substituent comprises a first reactive group $X^1$ and a second reactive group $X^2$ wherein $X^1$ is capable of reacting with $X^2$ to form a covalent bond.

Figure 1:
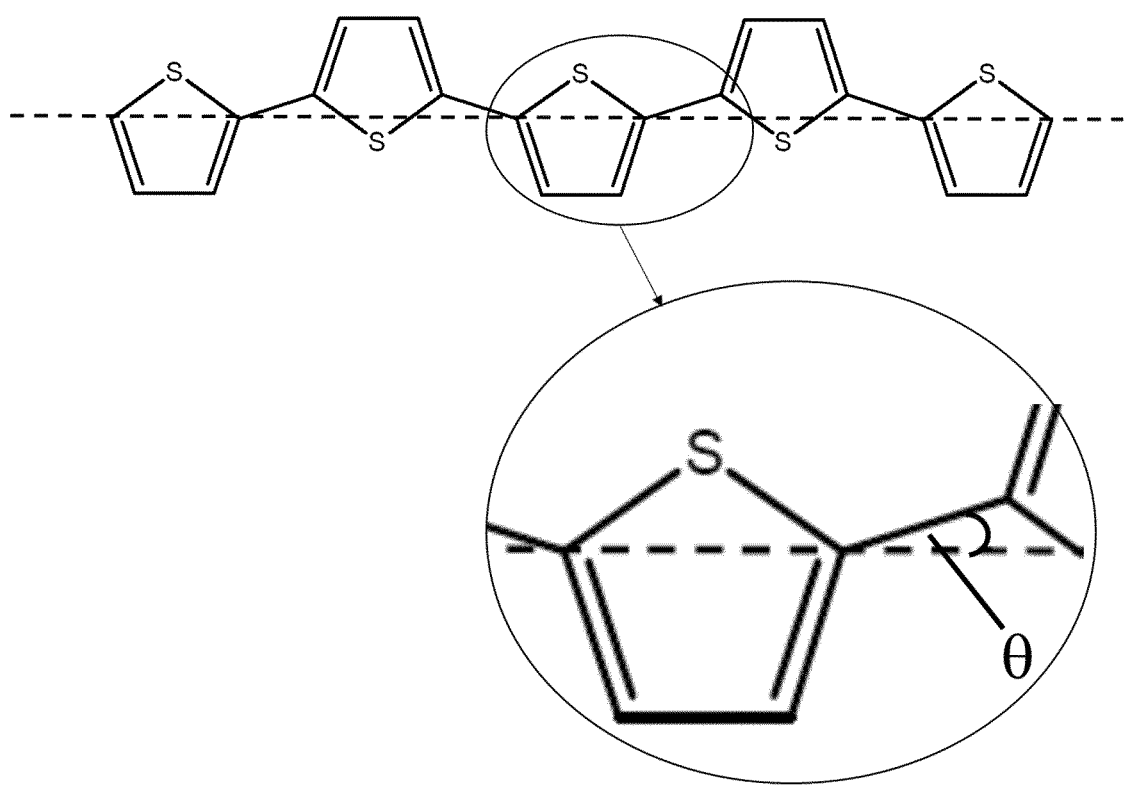
FIG. 1 illustrates a polythiophene oligomer.

The drawings are not drawn to scale and have various viewpoints and perspectives. The drawings are some implementations and examples. Additionally, some components and/or operations may be separated into different blocks or combined into a single block for the purposes of discussion of some of the embodiments of the disclosed technology. Moreover, while the technology is amenable to various modifications and alternative forms, specific embodiments have been shown by way of example in the drawings and are described in detail below. The intention, however, is not to limit the technology to the particular implementations described. On the contrary, the technology is intended to cover all modifications, equivalents, and alternatives falling within the scope of the technology as defined by the appended claims.

DETAILED DESCRIPTION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." Additionally, the words "herein," "above," "below," and words of similar import, when used in this application, refer to this application as a whole and not to any particular portions of this application. Where the context permits, words in the Detailed Description using the singular or plural number may also include the plural or singular number respectively. The word "or," in reference to a list of two or more items, covers all of the following interpretations of the word: any of the items in the list, all of the items in the list, and any combination of the items in the list. References to a layer "over" another layer when used in this application means that the layers may be in direct contact or one or more intervening layers are may be present. References to a layer "on" another layer when used in this application means that the layers are in direct contact.

The teachings of the technology provided herein can be applied to other systems, not necessarily the system described below. The elements and acts of the various examples described below can be combined to provide further implementations of the technology. Some alternative implementations of the technology may include not only additional elements to those implementations noted below, but also may include fewer elements.

These and other changes can be made to the technology in light of the following detailed description. While the description describes certain examples of the technology, and describes the best mode contemplated, no matter how detailed the description appears, the technology can be practiced in many ways. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms.

In the following description, for the purposes of explanation, numerous specific details are set forth in order to provide a thorough understanding of implementations of the disclosed technology. It will be apparent, however, to one skilled in the art that embodiments of the disclosed technology may be practiced without some of these specific details.

The present inventors have found that a high thermal conductivity structure may be formed by solution deposition of rigid rod-type oligomers. Optionally, thermal conductivity of oligomers as described herein is at least 0.2 Wm$^{-1}$K$^{-1}$, optionally at least 0.3, 0.4 or 0.5 Wm$^{-1}$K$^{-1}$.

The oligomers may be substituted with groups for bonding together of oligomer chains, e.g. hydrogen bonding or covalent bonding, to enhance long-range ordering of the oligomers.

Oligomers as described herein are preferably at least partially crystalline.

Oligomers as described herein preferably comprise an arylene or heteroarylene group which may be unsubstituted or substituted with one or more substituents.

Oligomers as described herein may undergo pi-pi stacking when deposited as a film.

Oligomers as described herein may have formula (I):

$$R^1 {-\!\!\!\left[\!\!\begin{array}{c} Ar^1 \\ | \\ (R^2)_p \end{array}\!\!\right]\!\!}_n\!\!- R^1 \quad (I)$$

wherein Ar$^1$ is an arylene or heteroarylene; n is at least 2; R$^1$ in each occurrence is independently H or a substituent; R$^2$ in each occurrence is independently H or a substituent; and p is 0 or a positive integer.

Optionally, n is 2-10.

Optionally, p is 0, 1, 2, 3 or 4.

Ar$^1$ may be a C$_{6-20}$ arylene or a 5-20 membered heteroarylene.

Ar$^1$ may be a monocyclic or polycyclic arylene or heteroarylene.

In some embodiments, each Ar$^1$ is the same.

In some embodiments, the oligomer contains two or more different Ar$^1$ groups. According to these embodiments, the oligomer preferably contains two different Ar$^1$ groups (A and B) in an alternating (ABAB . . . ) arrangement.

Exemplary Ar$^1$ groups include, without limitation, para-phenylene, thiophene, furan, benzobisoxazole, and combinations thereof. Exemplary oligomers include oligo-p-phenylene; oligothiophene; and oligo-(phenylene benzobisoxazole).

Preferably, Ar$^1$ groups are linked through aromatic carbon bonds.

Preferably, the oligomer is a rigid rod oligomer.

A rigid rod oligomer as described herein may have a structure in which a notional straight line can be drawn through each Ar$^1$ group of the oligomer, as illustrated in FIG. 1.

Optionally, each bond angle θ between the notional straight line and each bond of Ar$^1$ to an adjacent repeat unit is no more than 45 degrees.

The number and identity of R$^1$ and R$^2$ groups may be selected according to the desired solubility and/or reactivity of the oligomers.

Optionally, R$^1$ is selected from the group consisting of:
H;
F;
CN;
NO$_2$;
branched, linear or cyclic C$_{1-20}$ alkyl wherein one or more non-adjacent C-atoms may be replaced with O, S, NR$^3$, SiR$_4^2$, C=O OR COO; wherein R$^3$ in each occurrence is H or a substituent, preferably H or a C$_{1-20}$ hydrocarbyl group and R$^4$ in each occurrence is independently a substituent, optionally a C$_{1-20}$ hydrocarbyl group;
an aryl or heteroaryl group Ar$^3$ which is unsubstituted or substituted with one or more substituents; and
a reactive group comprising a first reactive moiety X$^1$ and a second reactive moiety X$^2$ wherein moieties X$^1$ and X$^2$ are capable of reacting to form a covalent bond.

Exemplary hydrocarbyl groups R$^3$ and R$^4$ include, without limitation, C$_{1-20}$ alkyl; unsubstituted phenyl; and phenyl substituted with one or more C$_{1-12}$ alkyl groups.

Substituents of Ar$^3$, where present, may be selected from C$_{1-20}$ alkyl wherein one or more non-adjacent C-atoms may be replaced with O, S, NR$^3$ or SiR$_4^2$.

Optionally, R$^2$ is selected from the groups described with respect to R$^1$ with the exclusion of H.

R$^1$ and/or R$^2$ groups may be selected so as to cause binding between R$^1$ groups of different oligomer chains; between R$^1$ and R$^2$ groups of different oligomer chains; and/or between R$^2$ groups of different oligomer chains.

Preferably, the same R$^1$ groups and/or the same R$^2$ groups of different oligomer chains are capable of forming a bond.

In some embodiments, the oligomer comprises R$^1$ and/or R$^2$ groups, preferably R$^2$ groups, which are capable of forming a hydrogen bond between oligomer chains.

Groups capable of hydrogen bonding include groups with an NH or OH group, for example groups of formulae -Sp-OH or -Sp-NHR³ wherein Sp is a flexible spacer group, e.g. an alkylene chain or a phenylene-alkylene chain, and $R^3$ is H or a substituent.

In some embodiments, the oligomer comprises $R^1$ and/or $R^2$ groups, preferably $R^2$ groups, which are capable of forming a covalent bond between oligomer chains.

Figure 2:
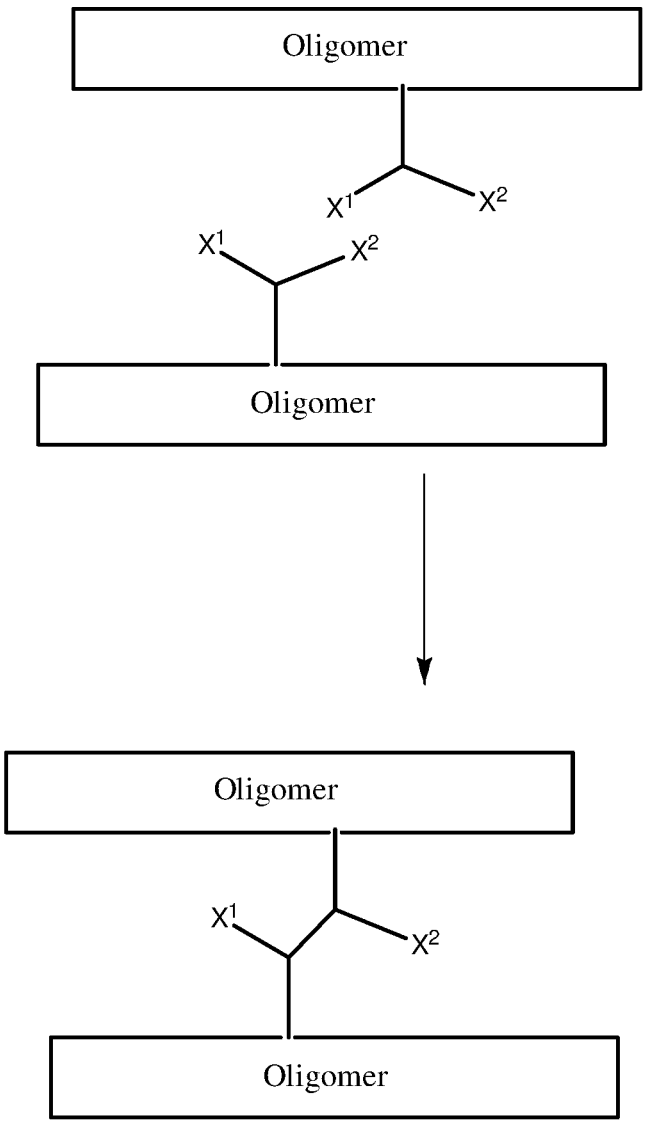
FIG. 2 schematically illustrates bonding between oligomer chains.

FIG. 2 schematically illustrates oligomer chains substituted with a substituent containing both reactive groups $X^1$ and $X^2$ wherein $X^1$ and $X^2$ are capable of reacting with one another to form a covalent bond. An $X^1$ group of one oligomer chain may react with an $X^2$ of another oligomer chain, leaving one unreacted $X^1$ group and one unreacted $X^2$ group.

The unreacted $X^1$ and $X^2$ groups may react with $X^1$ and $X^2$ groups of further oligomer chains, thereby creating a cross-linked oligomer.

$X^1$ and $X^2$ groups on different oligomer chains may initially hydrogen bond before reacting to create a cross-linked structure.

In some embodiments, $X^1$ is a group comprising a quinone and $X^2$ is a group comprising a diamine. The quinone and diamine groups may react to form an imide as per Scheme 1:

including, without limitation, spin-coating, dip-coating, drop-casting, spray coating and blade coating.

The formulation may be deposited onto an alignment layer, e.g. a rubbed polyimide.

Following deposition of the formulation, the formulation may be processed during or after solvent evaporation to enhance ordering of oligomer chains, e.g. by stretching or rubbing of the film.

Solvents may be selected according to their ability to dissolve or disperse the oligomer and any other components of the formulation. Exemplary solvents include, without limitation, benzene or naphthalene substituted with one or more substituents, optionally one or more substituents selected from $C_{1-12}$ alkyl, $C_{1-12}$ alkoxy, F and Cl; ethers; esters; halogenated alkanes; and mixtures thereof. Exemplary solvents include, without limitation, 1,2,4-trimethylbenzene, mesitylene, 1-methylnaphthalene, 1-chloronaphthalene, diiodomethane, anisole, and 1,2-dimethoxybenzene.

The film may consist of the oligomer or may contain one or more further materials, optionally one or more amorphous polymers, e.g. polystyrene, polyethylene or polypropylene.

Applications

A film comprising an oligomer as described herein may be used as an electrically non-conductive film, e.g. an underfill, for a flip chip including but not limited to 3D stacked multi-chips.

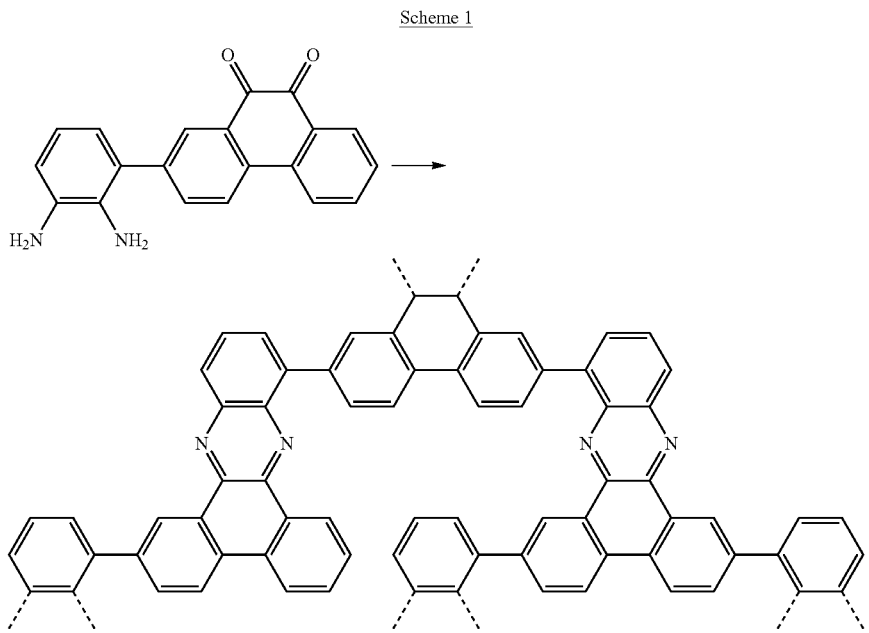

Scheme 1

It will be appreciated that a wide range of $X^1$ and $X^2$ groups which are capable of reacting to form a covalent bond are known to the skilled person including, without limitation, groups which undergo an elimination, substitution or cycloaddition reaction.

Film Formation

The oligomers of Formula (I) described herein are preferably soluble. The oligomers of Formula (I) preferably has a solubility of at least 0.1 mg/ml, optionally at least 0.5 mg/ml or at least 1 mg/ml in xylene at 50° C. and at atmospheric pressure.

A film of the oligomer may be deposited from a formulation comprising the oligomer and any other components of the film dissolved or dispersed in one or more solvents.

Figure 3:
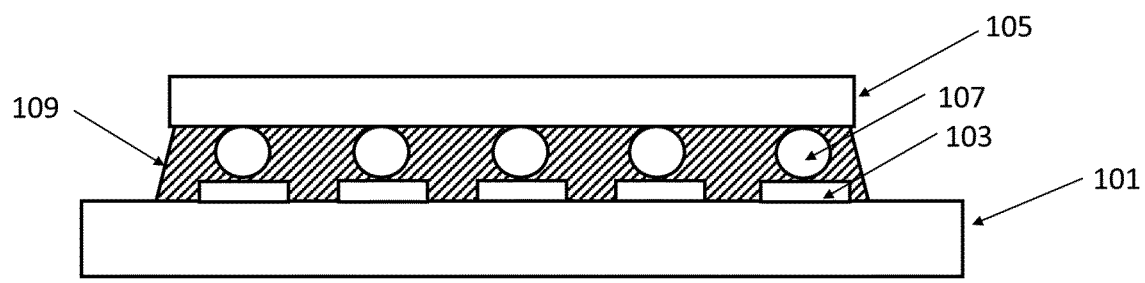
FIG. 3 schematically illustrates an electronic device according to some embodiments comprising a flip-chip electrically connected to a substrate.

Formulations as described anywhere herein may be deposited by any suitable solution deposition technique FIG. 3 illustrates an electronic device comprising a chip 105; a substrate 101, e.g. a printed circuit board; and electrically conductive interconnects 107 between electrically conductive pads 103 on the surface of the substrate 101 and the chip 105. Underfill 109 comprising or consisting of an oligomer as described herein fills the region between the chip 105 and substrate 101. Optionally, the oligomer is crosslinked.

Figure 4A:
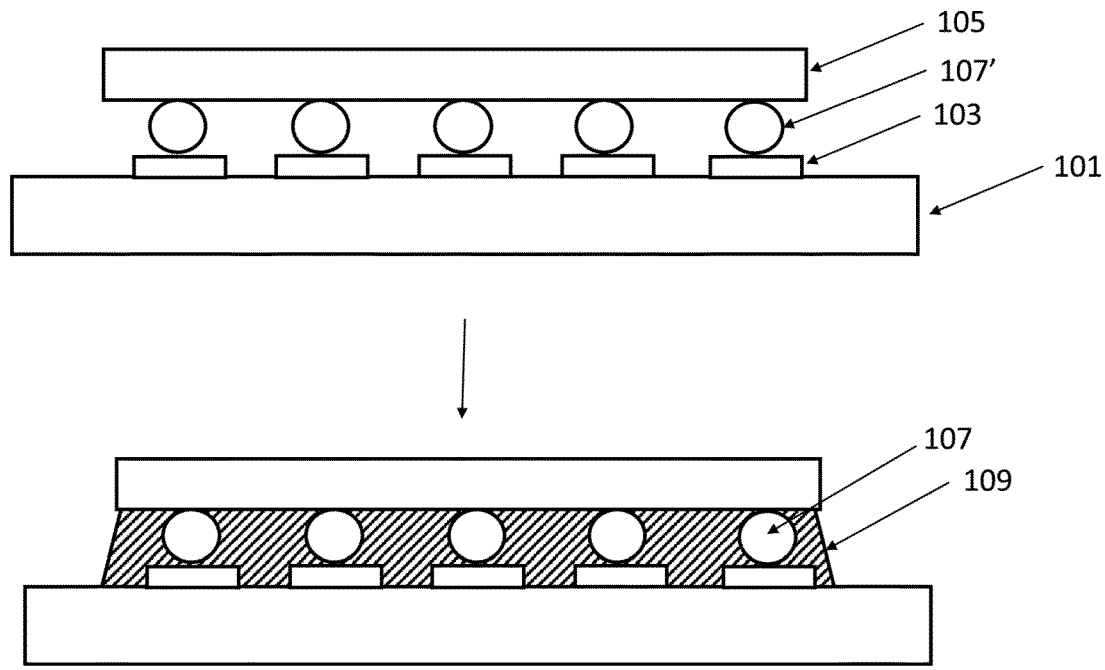
FIG. 4A schematically illustrates a method according to some embodiments of forming the electronic device of FIG. 3 in which an underfill layer is formed between the substrate and the flip-chip.

With reference to FIG. 4A, in some embodiments formation of an electronic device comprises bringing electrically conductive bumps 107', e.g. solder bumps, into contact with electrically conductive pads 103 disposed on a substrate 101, e.g. a printed circuit board to form interconnects 107 from electrically conductive bumps 107'. Formation of underfill 109 comprising an oligomer as described herein comprises application of a formulation comprising the oligomer into the overlap region between the chip 105 and the substrate 101.

Optionally, the oligomer is crosslinked following application of the formulation, e.g. by heat and/or UV treatment.

Figure 4B:
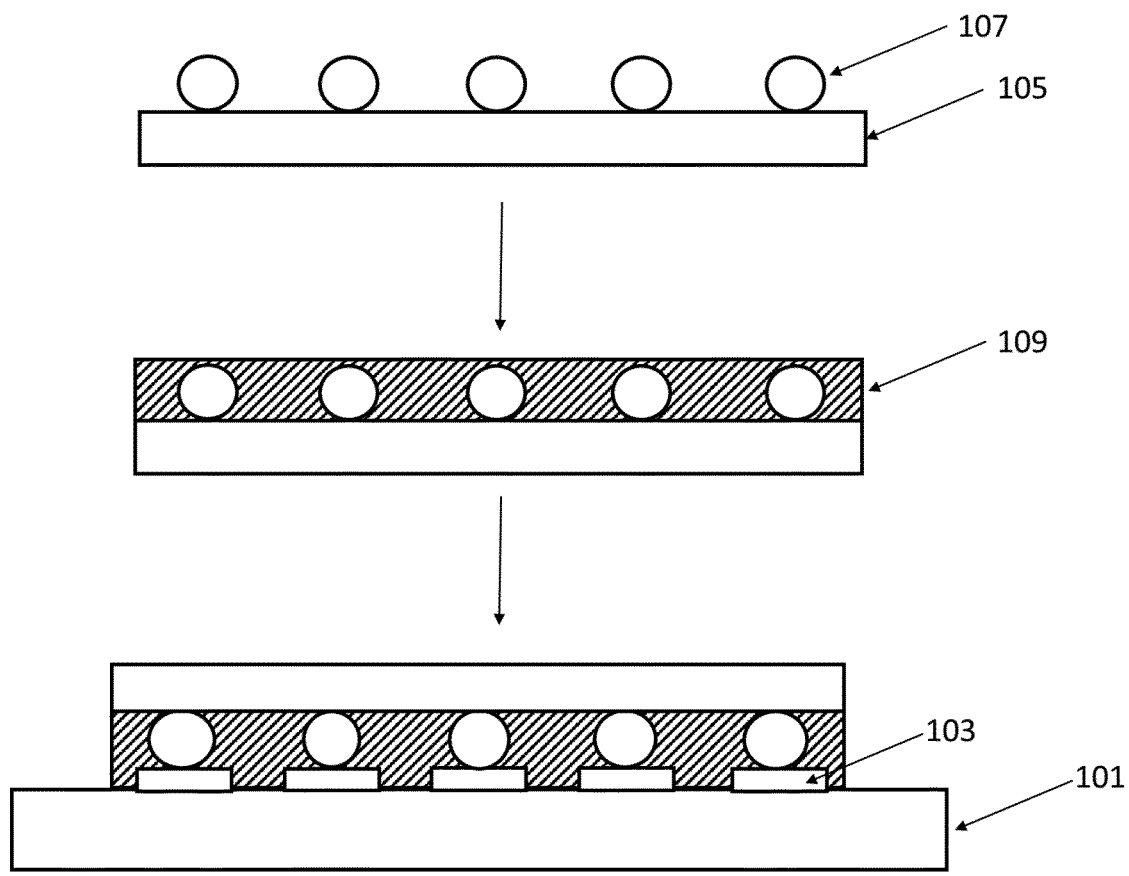
FIG. 4B schematically illustrates a method according to some embodiments of forming the electronic device of FIG. 3 in which a non-conducting film is applied to the flip chip prior to connection to the substrate.

With reference to FIG. 4B, in some embodiments a film 109 comprising the oligomer is applied over a surface of the chip 105 carrying electrically conductive bumps 107'. FIG. 4B illustrates complete coverage of the conductive bumps 107' however it will be understood that the conductive bumps 107' may be partially covered such that a part of the conductive bumps 107' protrude from a surface of the film 109. The conductive bumps 107' are then brought into contact with conductive pads 103 disposed on a substrate 101, e.g. a printed circuit board, to form electrically conductive interconnects between the substrate and the chip. Formation of the electrically conductive interconnects may comprise application of heat and/or pressure.

If the oligomer of film 109 is crosslinked then crosslinking may take place before, during or after the conductive bumps 107' are brought into contact with the conductive pads 103.

Figure 5:
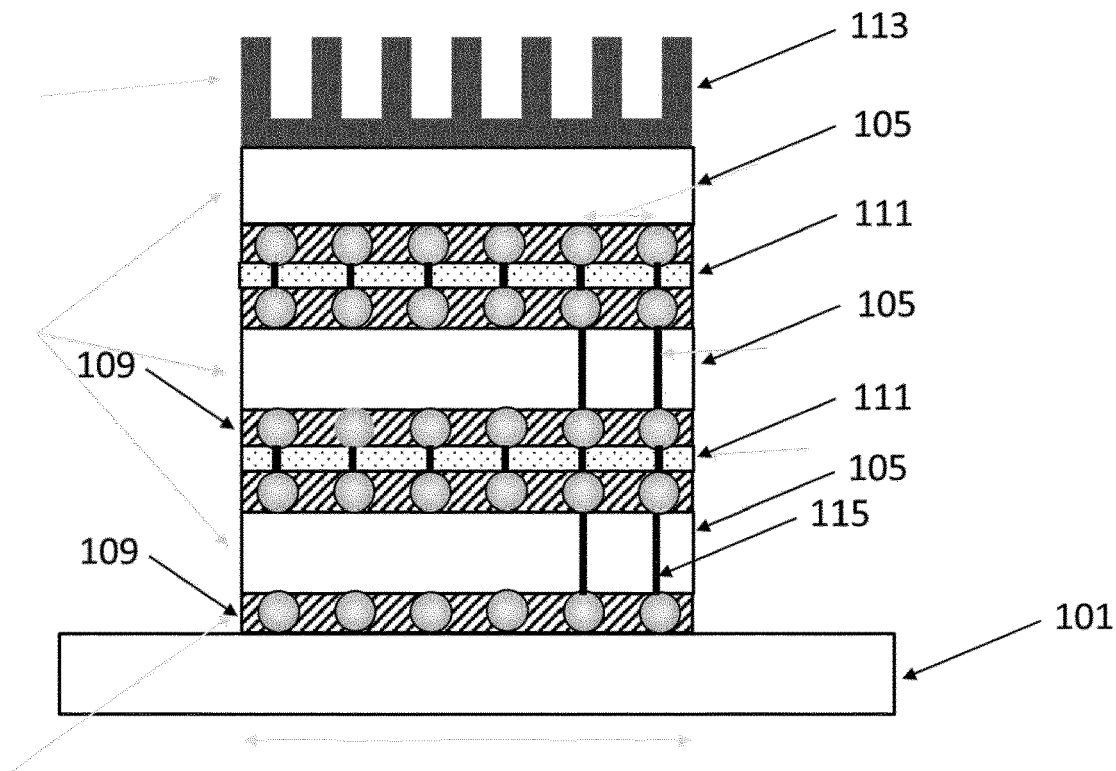
FIG. 5 schematically illustrates a 3D chip stack according to some embodiments.

Two or more chips may be connected with a film comprising an oligomer as described herein disposed between chips. FIG. 5 illustrates a 3D stack of chips 105 according to some embodiments, wherein the chips 105 are interposed by an interposer 111 and a non-electrically conductive film 109 disposed between adjacent interposer and chip surfaces and between the substrate 101, e.g. a printed circuit board, and a first chip of the 3D stack. At least one non-electrically conductive film 109 comprises an oligomer as described herein. Through-vias 115 are formed through the chips 105 and the interposers. The 3D stack may comprise a heat sink 113 disposed on a surface thereof.

In some embodiments, a film comprising or consisting of an oligomer as described herein may be disposed between an electronic device and a heat sink.

Examples

Thermal Conductivity Measurement

Figure 6:
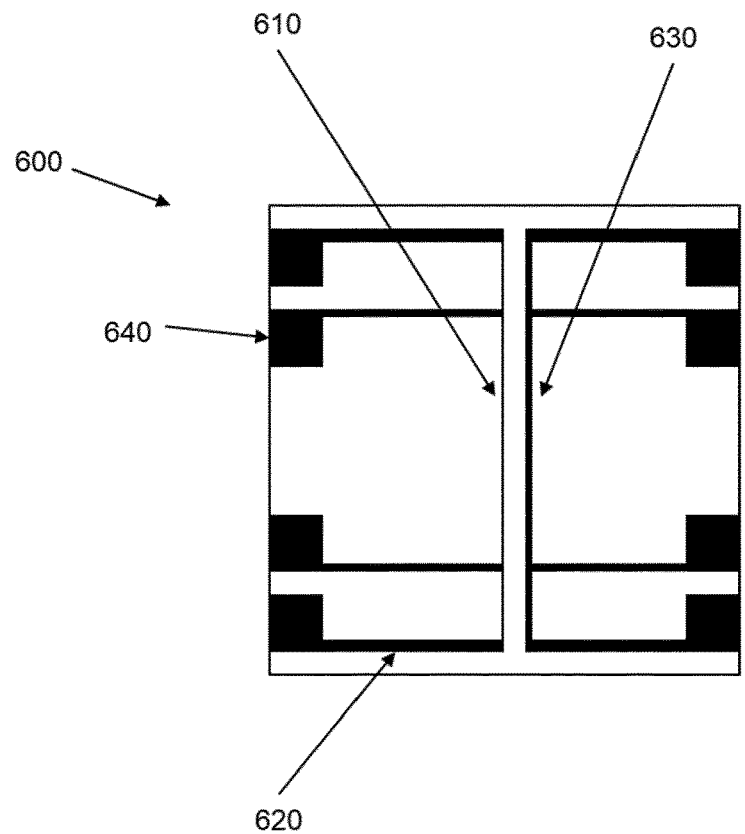
FIG. 6 schematically illustrates a substrate for measurement of thermal conductivity of a film.

A sensor substrate 600 (ca. 25 mm×25 mm) illustrated in FIG. 6 was used for measurement of thermal conductivity as described herein. The substrate has a polyethylene naphthalate (PEN) film (Dupont Teonex Q83, 25 µm) with a 200 nm thick heating structure consisting of a 20 micron wide heater line 610, 500 micron wide busbars 620 for application of a current and contact pads 640. A sensing structure mirrors the heating structure except that the heater line is replaced with a 200 micron wide sensor line 630.

Figure 7A:
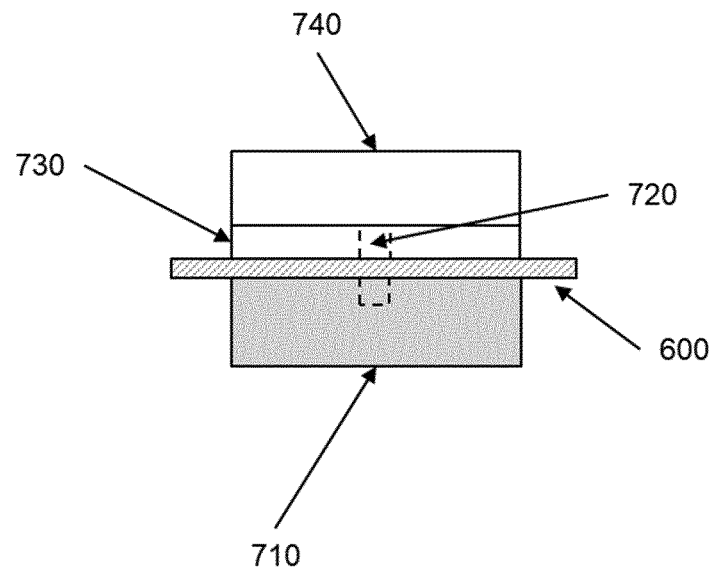
FIGS. 7A and 7B schematically illustrate apparatus for measurement of thermal conductivity including the substrate of FIG. 6.
Figure 7B:
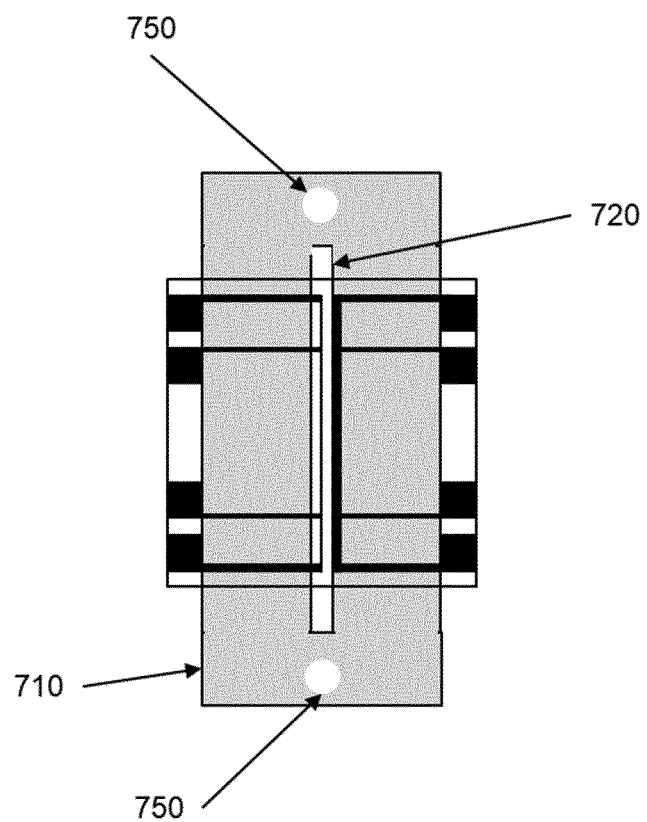

With reference to FIGS. 7A and 7B, the sensor substrate 600 carrying the film to be measured is placed on a temperature controlled aluminium block, regulated via a PID system such that the temperature may be controlled by software. The aluminium block has a long notch 720 of 1 mm width and −1 mm depth cut into it. The sensor substrate 600 is placed over the notch such that the central heater line 610 is aligned with the centre of the notch 720, and the sensor line 630 is aligned with the edge of the notch. A PMMA sheet 730 (2 mm thickness) with a notch cut-through matching that of the aluminium block 710 is placed over the top and an addition piece of plain PMMA sheet 740 (4 mm thickness) is placed on top to enclose the device. The entire assembly is clamped using bolts and nuts at positions 750. The heater line is connected to a sourcemeter unit (Keithley 2400) using a 4-wire measurement set up. The sensor line is connected to a multimeter unit (Keithley 2000) using a 4 wire set up.

The temperature of the assembly is first stabilised at a predetermined temperature. The resistance of the heater line and the temperature sensor is then measured. To measure the resistance of the heater line without causing undue heating a low current is sourced and voltage measured in short pulses, with time allowed between pulses for heat to be dissipated. A constant DC current is then passed along the heater line to cause resistive heating. The arrangement of the substrate in the assembly causes heat to flow through the substrate and film to the aluminium block which acts as a heat sink, setting up an approximate one dimensional steady state heat flux. The power dissipated in the heater line, and the resistance of the heater line and temperature sensor is additionally measured in this state. This process is repeated for increasing sourced current, and the complete process repeated at the next temperature setpoint.

The resistances of the heater line and sensor lines under the condition of no heat flux at different temperature setpoints are used as calibration data in a straight-line fit of resistance and temperature, allowing the temperature of the resistive elements to be determined under the condition of steady state heat flux. As such the temperature gradient, $\Delta T$, between the heater line and temperature sensor (aligned with the heatsink) can then be calculated. The power dissipated in the heater line is assumed to be completely converted to heat energy Q. A straight line fit is then made between dT and Q with additional parameters for the length of the heater line over which power is measured (L, 14.4 mm), the distance between the voltage sense points) and the gap width (2w, 1 mm). This provides a measure of the conductance C of the device under test and is affected by losses pertaining to conductive heat transfer in the substrate and convective and radiative heat transfer to the environment (h).

To calculate a thermal conductivity $\kappa$, the same measurement process is carried out on substrates without any test film (substrate only). We assume the losses will be approximately the same when measuring a coated vs uncoated substrate. We subtract the conductance of the substrate ($C_S$) from the device measurement ($C_{F+S}$) to adjust for these losses. The thermal conductivity ($k_F$) is then calculated by dividing the resulting film only conductance by the film thickness ($d_F$). The film thickness is determined using a digital micrometer by measuring the total thickness and subtracting the substrate thickness.

$$C = \frac{Qw}{2L\Delta T} = \kappa d + 2hw^2 \quad \kappa_F = \frac{C_{F+S} - C_S}{d_F}$$

Film Formation

Para-terphenyl and polystyrene (M.W 650000) (4:1 w/w) were dissolved in 1-methylnaphtalene at a concentration of 30 mg/ml. Polystyrene was added to the formulation to act as a binder between crystalline domains and promote adhesion to the substrate. The solution was heated to 80° C. to ensure full dissolution. The hot solution was drop cast onto 25 micron PEN substrates and left at 50° C. overnight to allow solvent evaporation and crystal formation. The presence of crystalline films was confirmed by the use of polarising optical microscopy. The crystalline films were heated at 120° C. for 30 minutes to remove residual solvent.

For films of about 6-10 micron thickness, a thermal conductivity of 0.5-0.9 $Wm^{-1}K^{-1}$ was measured, as compared to about 0.15 $Wm^{-1}K^{-1}$ for pure polystyrene.

Without wishing to be bound by any theory, the rigid-rod oligomers self-assemble into ordered domains following solution deposition, and this long range ordering increases thermal conductivity in comparison to an amorphous film.

Oligomer Reaction

Amino-p-terphenyl and p-terphenyl-carboxaldehyde were reacted by depositing each component sequentially on glass substrates from xylene solution and removal of the solvent by drying in ambient conditions after each deposition. The film of combined components was then heated on a hotplate at 120° C. The solid was then removed from the substrate for analysis by FTIR, which confirmed the presence of an imine bond and the loss of carbonyl and amine functionality: The product showed a new peak at 1620 cm-1, not present in any of the FTIR of the starting materials, which is attributed to an imine bond, confirming the occurring of an imine condensation reaction. A reduction of the intensity of the C═O stretching mode at 1700 cm-1, characteristic of the p-terphenyl-carboxyaldehyde starting material, was observed. The N—H stretching modes at 3200-3400 cm-1, characteristic of the amino-p-terphenyl starting material was not present in the product FTIR. These observations indicate that the starting oligomers underwent a reaction to form an imine bond between oligomer chains.

Crosslinking

A reaction between phenanthrenequinone and phenylenediamine, as illustrated in Scheme 1, was carried out in solution and solid state. The formation of the reaction product was confirmed after heating at 120° C. in both cases by FTIR and NMR.

FTIR of the product showed a new peak at 1605 cm-1 attributed to the C═N amide bond. Moreover, the N—H stretching peaks at 3000-3200 cm-1, characteristic of the phenyldiamine starting material and the C═O stretching at 1674 cm-1 of the phenantrenequinone starting material were not present in the FTIR of the product indicating the occurring of the imine condensation reaction.

The invention claimed is:

1. An electronic device comprising a first chip having a first surface; a functional layer having a surface facing the first chip first surface; electrically conducting interconnects between the first chip and the functional layer; and an electrically non-conducting film disposed in a region between the first surface of the first chip and the first surface of the functional layer and between the interconnects, wherein the electrically non-conducting film comprises covalently bound rigid-rod oligomers, each rigid-rod oligomer comprising an arylene or heteroarylene repeating unit; and an imine group is disposed between the rigid-rod oligomers.

2. The electronic device according to claim 1 wherein the rigid-rod oligomers are crosslinked.

3. The electronic device according to claim 1 wherein thermal conductivity of the electrically non-conducting film is at least 0.2 $Wm^{-1}K^{-1}$.

4. The electronic device according to claim 1 wherein the functional layer is selected from a printed circuit board; an interposer; and a second chip.

5. An electronic device according to claim 1 wherein the electronic device comprises a 3D chip stack.

6. A method of forming an electronic device according to claim 1 wherein electrically conductive features on the first surface of the first chip are brought into contact with electrically conductive features on the first surface of the functional layer; and wherein formation of the electrically non-conducting film comprises introducing a formulation comprising the rigid-rod oligomers dissolved in one or more solvents into the region between the first chip and the functional layer.

7. The method according to claim 6 wherein formation of the electrically non-conducting film comprises crosslinking of the rigid-rod oligomers.

8. The method according to claim 7 wherein the crosslinking comprises reacting reactive substituents of the rigid-rod oligomers.

9. The method according to claim 8 wherein the reactive substituents comprise a first reactive group $X^1$ and a second reactive group $X^2$ wherein $X^1$ is capable of reacting with $X^2$ to form the imine group.

10. A method of forming an electronic device according to claim 1, the method comprising forming the electrically non-conducting film over electrically conductive features on the first surface of the first chip; and bringing the electrically conductive features on the first surface of the first chip into contact with electrically conductive features on the first surface of the functional layer.

11. The method according to claim 10 wherein forming the electrically non-conducting film comprises crosslinking of the rigid-rod oligomers.

12. The method according to claim 11 wherein the crosslinking comprises reacting reactive substituents of the rigid-rod oligomers.

13. The method according to claim 12 wherein the reactive substituents comprise a first reactive group $X^1$ and a second reactive group $X^2$ wherein $X^1$ is capable of reacting with $X^2$ to form the imine group.

14. A method of forming a film comprising depositing a formulation comprising rigid-rod oligomers dissolved or dispersed in one or more solvents onto a surface; evaporating the one or more solvents; and reacting reactive substituents of the rigid-rod oligomers to form a covalent bond comprising an imine group between oligomer chains.

15. A method according to claim 14 wherein the reactive substituents comprise a first reactive group $X^1$ and a second reactive group $X^2$ wherein $X^1$ is capable of reacting with $X^2$ to form the imine group.

* * * * *